United States Patent
Zhang

(10) Patent No.: US 12,193,220 B2
(45) Date of Patent: Jan. 7, 2025

(54) SEMICONDUCTOR STRUCTURE AND METHOD FORMING THE SAME

(71) Applicant: ChangXin Memory Technologies, Inc., Hefei (CN)

(72) Inventor: Kui Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/777,522

(22) PCT Filed: Feb. 28, 2022

(86) PCT No.: PCT/CN2022/078509
§ 371 (c)(1),
(2) Date: May 17, 2022

(87) PCT Pub. No.: WO2023/130550
PCT Pub. Date: Jul. 13, 2023

(65) Prior Publication Data
US 2024/0121946 A1   Apr. 11, 2024

(30) Foreign Application Priority Data
Jan. 6, 2022 (CN) .......... 202210010264.X

(51) Int. Cl.
*H01L 21/00* (2006.01)
*H10B 12/00* (2023.01)

(52) U.S. Cl.
CPC ........... *H10B 12/482* (2023.02); *H10B 12/05* (2023.02); *H10B 12/315* (2023.02); *H10B 12/488* (2023.02)

(58) Field of Classification Search
CPC .... H10B 12/482; H10B 12/05; H10B 12/315; H10B 12/488
See application file for complete search history.

(56) References Cited

U.S. PATENT DOCUMENTS

| | | |
|---|---|---|
| 10,734,388 B1 | 8/2020 | Karda et al. |
| 2016/0163637 A1 | 6/2016 | Jung et al. |

(Continued)

FOREIGN PATENT DOCUMENTS

| | | |
|---|---|---|
| CN | 102034759 A | 4/2011 |
| CN | 102903668 A | 1/2013 |

(Continued)

OTHER PUBLICATIONS

PCT/CN2022/078509 International Search Report mailed Sep. 27, 2022.
PCT/CN2022/078509 Written Opinion mailed Sep. 27, 2022.

*Primary Examiner* — Richard A Booth
(74) *Attorney, Agent, or Firm* — Kilpatrick Townsend & Stockton LLP

(57) ABSTRACT

A semiconductor structure and a manufacturing method are provided. The semiconductor structure includes: a substrate having a bit line extending along a first direction; a semiconductor channel located on the bit line; a semiconductor doping layer located on the side of the bit line, wherein the top surface of the semiconductor doping layer is connected to the semiconductor channel contact; a word line extending in the second direction, encircling part of the semiconductor channel, and the bottom surface of the word line is higher than the top surface of the bit line; a word line dielectric layer located between the word line and the semiconductor channel; an isolation layer located between the word line and the bit line and between the word line and the semiconductor doping layer. The device and method improve the prior weak electrical conductivity between the bit line structure and the active structure.

19 Claims, 49 Drawing Sheets

(56) References Cited

U.S. PATENT DOCUMENTS

2022/0052052 A1*   2/2022   Wu ..................... H10B 12/488
2023/0020711 A1*   1/2023   Han ..................... H10B 12/30

FOREIGN PATENT DOCUMENTS

CN   111211170 A   5/2020
CN   111785719 A   10/2020

\* cited by examiner

SEMICONDUCTOR STRUCTURE AND METHOD FORMING THE SAME

CROSS REFERENCE

This application claims the priority to Chinese patent application No. 202210010264.X, filed on Jan. 6, 2022, and entitled "SEMICONDUCTOR STRUCTURE AND METHOD FORMING THE SAME", the disclosure of which is incorporated herein by reference in entirety.

TECHNICAL FIELD

Embodiments of the present disclosure relate to the field of semiconductors, and in particular to a semiconductor structure and a manufacturing method.

BACKGROUND

The semiconductor storage devices usually include word lines and bit lines. In order to improve the integration level of the integrated circuit and the working speed of the storage structure, and reduce its power consumption, the buried word line structure or GAA (Gate-All-Around) structure are gradually introduced. When using these word line structures, to find ways to improve the weak electrical conductivity between the bit line structure and the active structure and to improve the stability of the semiconductor structure has become an important and urgent problem to solve by those in the field.

SUMMARY

Embodiments of the present disclosure provide a semiconductor structure and a manufacturing method, which are at least beneficial to solve the problem of weak electrical conductivity between the bit line structure and the active structure.

According to some embodiments of the present disclosure, one embodiment of the present disclosure provides a semiconductor structure, comprising: a substrate with a bit line extending in a first direction on the substrate; a semiconductor channel, the semiconductor channel is located on the bit line; a doping layer, the semiconductor doping layer is located on the side of the bit line, and the top surface of the semiconductor doping layer is in contact with the semiconductor channel; wherein the word line extending along the second direction surrounds part of the semiconductor channel, and the bottom surface of the word line is higher than the top surface of the bit line; the word line dielectric layer, located between the word line and the semiconductor channel; the isolation layer, located between the word line and the bit line and between the word line and the semiconductor doping layer.

In addition, in the first direction, the bit line has at least two rows of semiconductor channels arranged at intervals, and the semiconductor doping layers are located on both sides of the bit line.

In addition, there are at least two bit lines, and the semiconductor doping layer is located on one side of the bit lines.

In addition, the semiconductor doping layers of the two adjacent bit lines are located on different sides of the bit lines.

In addition, the material of the bit line includes metal. The semiconductor structure further includes: a dielectric layer, the dielectric layer is located on the top surface of the bit line, and the semiconductor doping layer is located on the side surface of the dielectric layer, and the semiconductor channel is located on the surface of the dielectric layer.

In addition, the substrate is a semiconductor substrate; the semiconductor structure further comprises: a barrier layer, the barrier layer is located in the substrate and protrudes above the substrate, and the semiconductor channel is located on part of the top surface of the barrier layer.

In addition, the isolation layer is also located on the top surface of the barrier layer exposed from the semiconductor channel, and the isolation layer is located between the word line and the barrier layer.

In addition, the word line is located on the top surface of the barrier layer exposed by the semiconductor channel.

In addition, in the direction parallel to the second direction, the width of the bit line is 2 times to 3.5 times the maximum width of the semiconductor channel.

In addition, parallel to the second direction, the range of the maximum width of the semiconductor channel is 10 nm~20 nm.

In addition, the semiconductor doping layer contains N-type ions or P-type ions. The semiconductor channel includes: a channel region, wherein the semiconductor channel region facing the word line is the channel region, the channel region is doped with N-type ions or P-type ions; in the doping region, the region of the semiconductor channel outside the channel region is the doping region, and the type of impurity ions in the doping region is the same as the type of the impurity ions in the semiconductor doping layer.

In addition, the type of dopant ions in the channel region is different from the type of dopant ions in the semiconductor doping layer.

In addition, the orthographic projection area of the bit line on the substrate ranges from 0.5 times to 0.8 times the orthographic projection area of the semiconductor channel on the substrate.

In addition, the material of the semiconductor channel is the same as the material of the semiconductor doping layer, and the material of the semiconductor channel includes silicon, germanium or silicon germanium.

In addition, the word lines include word lines arranged at intervals, and the semiconductor structure further includes: a first isolation layer, the first isolation layer is located between the adjacent word lines; a second isolation layer, the second isolation layer is located on the word line and the first isolation layer, and the second isolation layer is also located on the side of the semiconductor channel away from the word line.

According to some embodiments of the present disclosure, another aspect of the present disclosure also provides a method for fabricating a semiconductor structure, comprising: providing a substrate with bit lines extending in a first direction on the substrate; forming a semiconductor doping layer and a semiconductor channel, wherein the semiconductor channel is located on the bit line, the semiconductor doping layer is located on the side of the bit line, wherein the top surface of the semiconductor doping layer is in contact with the semiconductor channel; forming a word line dielectric layer and a word line extending in a direction, wherein the word line surrounding part of the semiconductor channel, wherein the bottom surface of the word line is arranged higher than the top surface of the bit line, and wherein the word line dielectric layer is located between the word line and the semiconductor channel; and forming an isolation layer, the isolation layer is located between the word line and the bit line and also between the word line and the semiconductor doping layer.

In addition, the process steps of forming the semiconductor doping layer and the semiconductor channel includes: providing a stacked initial semiconductor substrate and a first doping layer, wherein the first doping layer is doped with N-type ions or P-type ions, and the first doping layer has a bit line; forming a semiconductor layer on the top surface of the first doping layer and the bit line; patterning the semiconductor layer and the first doping layer, the remaining semiconductor layer becomes the semiconductor channel, and the remaining first doping layer becomes the semiconductor doping layer.

In addition, a selective epitaxy process is applied to form a second doping layer, and the second doping layer has a trench; before patterning the semiconductor layer and the first doping layer, further comprising: forming a sacrificial layer, the sacrificial layer fills the trench; after patterning the semiconductor layer and the first doping layer, removing the sacrificial layer.

In addition, after the word line is formed, the method further includes: performing doping treatment on the semiconductor channel higher than the top surface of the word line, and the type of doping ions in the doping treatment are of the same type as the dopant ions in the semiconductor doping layer.

The technical scheme provided by the embodiments of the present disclosure has at least the following advantages:

According to the embodiments of the present disclosure, the semiconductor channel is located on the bit line, and the semiconductor doping layer is located on the side surface of the bit line, which increases the contact area between the bit line structure and the active structure, beneficial in improving the weak conductivity between the bit line structure and the active structure. This is conducive to improving the stability of the semiconductor structure. The word line surrounds part of the semiconductor channel, that is, the semiconductor structure is a GAA structure, and the GAA structure can realize the gate four-sided surrounding of the semiconductor channel region, largely solving the problems of current leakage, capacitance effect and short channel effect caused by the reduction of the gate pitch size, reducing the projected vertical area of the word lines on the substrate. This is conducive to enhancing the gate control performance and increasing integration level of semiconductor structures.

In addition, in the first direction, the bit line has at least two rows of semiconductor channels arranged at intervals, beneficial to enhancing the control performance of the bit line; since the word line surrounds part of the semiconductor channel, it is equivalent to having two word lines controlled by the same bit line, increasing the control ability of the bit line to the word line, and further improving the stability of the semiconductor structure.

BRIEF DESCRIPTION OF THE DRAWINGS

One or more embodiments are exemplified the accompanying drawings, these exemplary descriptions do not constitute limitations to the embodiments, unless there is a special statement. The figures in the accompanying drawings do not constitute a scale limit, unless otherwise stated. In order to more clearly illustrate the technical solutions in the embodiments of the present disclosure or in the traditional technology, the accompanying drawings will be briefly introduced below. Obviously, the drawings in the following description are only some embodiments of the present disclosure. For those of ordinary skill in the art, other drawings can also be obtained based on these drawings without any creative effort.

DETAILED DESCRIPTION OF THE PREFERRED EMBODIMENTS

Figure 1:
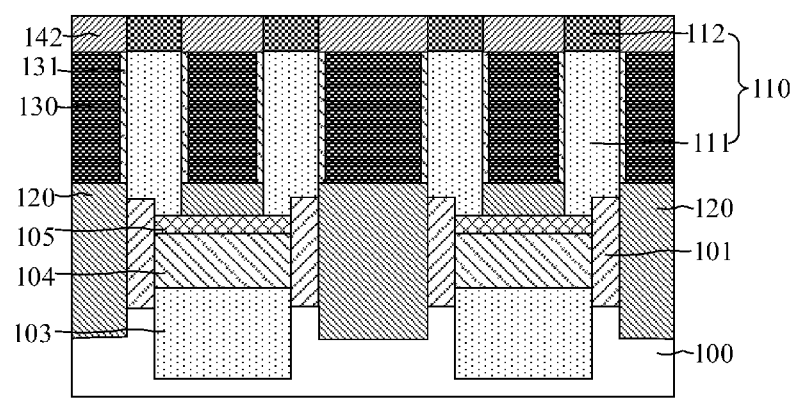
FIG. 1 is a schematic structural diagram of a semiconductor structure provided by an embodiment of the present disclosure.

It is described from the background art that the current semiconductor structures have the problem that the electrical conductivity between the bit line structures and the active structures can be weak.

Based on analysis, the main causes for the above problem include: to improve the integration level and the working speed of DRAM, simultaneously reduce the power consumption, the current DRAM structure is mainly based on buried word line structures, or GAA structures are dominant. Among them, in the GAA structure, a word line structure surrounds the active structure, and the word line structure is located on the bit line structure, which makes the contact area between the bit line structure and the active structure to be too small, which in turn leads to the existence of too weak conduction problem between the bit line structure and the active structure in the semiconductor device.

The present disclosure provides a semiconductor structure, comprising: a substrate with a bit line extending along a first direction on the substrate; a semiconductor channel, the semiconductor channel is located on the bit line; a semiconductor doping layer, the semiconductor doping layer is located on the bit line; the side surface of the semiconductor doping layer is in contact with the semiconductor channel; the word line which extends along the second direction, the word line surrounds part of the semiconductor channel, and the bottom surface of the word line is higher than the top surface of the bit line; the word line dielectric layer which is located between the word line and the semiconductor channel; the isolation layer is located between the word line and the bit line and between the word line and the semiconductor doping layer, the semiconductor channel and the semiconductor doping layer are active structures, that is, the doping layer acts as the device source and drain of the semiconductor structure, the semiconductor channel is located on the bit line and the semiconductor doping layer is located on the side of the bit line, which increases the contact area between the bit line structure and the active structure, which is beneficial in improving the previous weak electrical conductivity between the bit line structure and the active structures and improving the stability of the semiconductor structure; the word line surrounds part of the semiconductor channel, that is, the semiconductor structure is a GAA structure, and the GAA structure can realize contact of the gate to the four sides of the semiconductor channel region. The package can largely solve the problems of leakage current, capacitance effect and short channel effect caused by the reduction of the gate pitch size, reduce the occupied area of the word line in the vertical direction, and is conducive to enhancing the gate control performance and improve the integration level of semiconductor structures.

Embodiments of the present disclosure will be described in detail below with reference to the accompanying drawings. However, those of ordinary skill in the art can appreciate that, in the various embodiments of the present disclosure, many technical details are set forth for the reader to better understand the present disclosure. However, even without these technical details and various changes and modifications based on the following embodiments, the technical solutions claimed in the present disclosure may be possibly realized.

Figure 2:
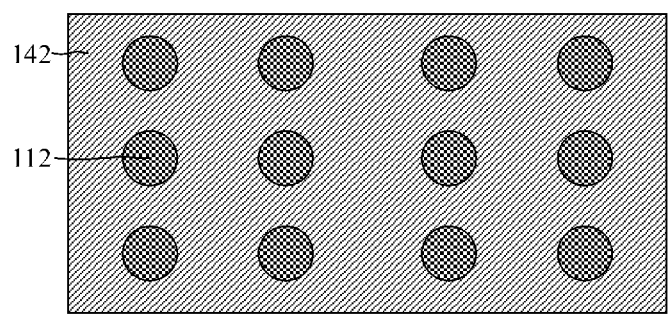
FIG. 2 is a top view of a semiconductor structure provided by an embodiment of the present disclosure.

Referring to FIGS. 1 and 2, FIG. 1 is a schematic structural diagram of a semiconductor structure provided by an embodiment of the disclosure, and FIG. 2 is a top view of the semiconductor structure provided by an embodiment of the disclosure. The semiconductor structure includes: a substrate 100 with a bit line 104 extending in a first direction on the substrate; a semiconductor channel 110, the semiconductor channel 110 is located on the bit line 104; a semiconductor doping layer 101, the semiconductor doping layer 101 is located on the side of the bit line 104, the top surface of the semiconductor doping layer 101 is in contact with the semiconductor channel 110; the word line 130 extending along the second direction, the word line 130 surrounds part of the semiconductor channel 110, and the bottom surface of the word line 130 is higher than the top surface of the bit line 104; word Line dielectric layer 131, the word line dielectric layer 131 is located between the word line 130 and the semiconductor channel 110; isolation layer 120, the isolation layer 120 is located between the word line 130 and the bit line 104 and between the word line 130 and the semiconductor doping layer 101.

In some embodiments, the substrate 100 is a semiconductor substrate. Specifically, the semiconductor substrate may include, but is not limited to, any one of a silicon substrate, a germanium substrate, a silicon germanium substrate, or a silicon carbide substrate.

In some embodiments, in the first direction, the bit line 104 has at least two rows of semiconductor channels 110 arranged at intervals, the word line 130 surrounds part of the semiconductor channel 110, and the semiconductor doping layer 101 is located on the bit line 104. On both sides, the contact area between the bit line 104 and the semiconductor doping layer 101 is increased, which is beneficial to improving the electrical conductivity between the bit line structure and the active structure, thereby improving the stability of the semiconductor structure.

In some embodiments, the material of the bit line 104 includes a metal, and the metal may be cobalt, nickel, molybdenum, titanium, tungsten, tantalum or platinum. The resistance of the metal itself is small, which reduces the doping of the bit line 104 and the semiconductor. The contact resistance of the layer 101 can effectively avoid the problem of leakage current, and is beneficial to improving the conductivity of the bit line 104 and the semiconductor doping layer 101; and the bit line 104 can be a single-layer structure or a stacked-layer structure. In other embodiments, the material of the bit line is the same as the material of the substrate, and the bit line has doping ions of the same type as the doping ions in the semiconductor doping layer, and the doping ions serve as carriers, which can improve the migration and diffusion between the inner bit line and the semiconductor doping layer, beneficial to improving the conductivity of the bit line and the semiconductor doping layer. The material of the bit line is the same as that of the substrate, so the bit line can be regarded as an extension of the substrate, thus that it can simplify the process flow and avoid interface defects caused by the contact of different materials.

In some embodiments, the semiconductor structure further includes: a barrier layer 103, the barrier layer 103 is located in the substrate 100 and protrudes above the substrate 100, the semiconductor channel 110 is located on a part of the top surface of the barrier layer 103, and the barrier layer 103 is used for blocking ions diffused between the bit line 104 and the substrate 100, and the ions include dopant ions or metal ions. The barrier layer 103 is located in the substrate 100 and protrudes above the substrate 100, which means that the bottom surface of the bit line 104 in contact with the barrier layer 103 is higher than the top surface of the substrate 100 in contact with the semiconductor doping layer 101, can effectively prevent the metal ions or doping ions of the bit line 104 from diffusing into the substrate 100, which is beneficial to improving the conductivity of the bit line 104 and the semiconductor doping layer 101; the blocking material of layer 103 is silicon nitride. In other embodiments, the material of the barrier layer may be silicon dioxide or other materials with high dielectric constant.

In some embodiments, the semiconductor structure further includes: a dielectric layer 105, the dielectric layer 105 is located on the top surface of the bit line 104, and the semiconductor doping layer 101 is also located on the side surface of the dielectric layer 105, and the semiconductor channel 110 is located on the surface of the dielectric layer 105; the upper surface of the dielectric layer 105 in contact with the semiconductor channel 110 is not higher than the upper surface of the semiconductor doping layer 101 in contact with the semiconductor channel 110, which is beneficial to the formation of the semiconductor channel 110, thereby improving the integrity of the formation of the semiconductor channel 110, and furthermore it is beneficial to improving the conductivity of the semiconductor channel 110.

In some embodiments, the upper surface of the dielectric layer 105 in contact with the semiconductor channel 110 is lower than the upper surface of the semiconductor doping layer 101 in contact with the semiconductor channel 110; the dielectric layer 105 is used to prevent metal in the bit line 104 from diffusion, the dielectric layer 105 may also be regarded as a part of the bit line 104, and the material of the dielectric layer 105 may include but not limited to any one of titanium nitride or other nitrogen-containing metal materials. In other embodiments, the upper surface of the dielectric layer in contact with the semiconductor channel is flush with the upper surface of the semiconductor doping layer in contact with the semiconductor channel.

In some embodiments, in the direction parallel to the second direction, the width of the bit line 104 is 2 times to 3.5 times the maximum width of the semiconductor channel 110, and specifically may be 2 times, 2.8 times, 3.3 times or 3.5 times, the width of the bit line 104 is less than twice the maximum width of the semiconductor channel 110, the width of the word line 130 between the adjacent semiconductor channels 110 is smaller, and the word line 130 does not have enough area to function, thus reducing the control ability of word line 130; the width of the bit line 104 is greater than 3.5 times the maximum width of the semiconductor channel 110, which is equivalent to increasing the width of the semiconductor structure in the second direction, thereby reducing the integration degree of the semiconductor device.

In some embodiments, parallel to the second direction, the maximum width of the semiconductor channel 110 ranges from 10 nm to 20 nm, specifically 10 nm, 13 nm, 15 nm or 20 nm; the positive projected area width of the bit line 104 on the substrate 100 compared to the orthographic projected area of the semiconductor channel 110 on the substrate 100 ranges from 0.5 times to 0.8 times, specifically 0.5 times, 0.6 times, 0.7 times or 0.8 times, which ensures the contact area between the bit line 104 and the semiconductor channel 110. It is beneficial to improving the previous weak electrical conductivity between the bit line structure and the active structure, and is further beneficial to improving the stability of the semiconductor structure.

In some embodiments, the material of the semiconductor channel 110 and the material of the semiconductor doping layer 101 may be the same, and specifically may be silicon, germanium or silicon germanium, so as to improve the connection between the semiconductor channel 110 and the semiconductor doping layer 101. The interface properties are beneficial to improving the interface state defects, thereby improving the electrical properties of the semiconductor structure. In other embodiments, the material of the semiconductor channel and the material of the semiconductor doping layer may be different.

In some embodiments, the semiconductor channel 110 may include: a channel region 111, the region of the semiconductor channel 110 facing the word line 130 is the channel region 111, and the channel region 111 is doped with N-type ions or P-type ions; doped region 112, the region of the semiconductor channel 110 other than the channel region 111 is the doped region 112, and the type of doped ions in the doped region 112 is the same as the type of doped ions in the semiconductor doping layer 101.

In some embodiments, the type of dopant ions in the channel region 111 is different from the type of dopant ions in the semiconductor doping layer 101, which is equivalent to a junction transistor, and the "junction" here refers to s a PN junction, that is, the transistor composed of the semiconductor channel 110 has a PN junction, a device where the majority carriers are used as conductive devices, so it can avoid the problems of minority carrier storage and diffusion, and the majority carrier speed is high, which is conducive to improving conductivity of the semiconductor channel 110.

In other embodiments, the type of doping ions in the channel region is the same as the type of doping ions in the semiconductor doping layer, which is equivalent to the semiconductor structure being a junctionless transistor, where "junctionless" refers to the fact there is no PN junction, that is, there is no PN junction in the transistor formed by the semiconductor channel. On the one hand, there is no need to perform additional doping on the doped region, thus avoiding the problem that the doping process of the doped region is difficult to control, especially as the transistor size is further reduced, if the doped region is additionally doped, the impurity concentration is more difficult to control; on the other hand, because the device is a junctionless transistor, it is beneficial to avoid the phenomenon of ultra-steep source-drain concentration gradient doping process and the formation of ultra-steep PN junctions in the nanoscale range, thus avoiding doping mutation. The resulting problems such as threshold voltage drift and leakage current increase are beneficial in suppressing the short-channel effect, and can still work in the scale of several nanometers, thus helping to further improve the integration density and electrical performance of semiconductor structures. It can be understood that the additional doping here refers to doping to make the doping ion type of the doped region different from the doping ion type of the channel region.

In some embodiments, the doping ions are N-type ions or P-type ions, the N-type ions may specifically be phosphorus ions, arsenic ions or antimony ions, and the P-type ions may specifically be boron ions, indium ions or boron fluoride ions.

In some embodiments, the material of the semiconductor doping layer 101 and the material of the substrate 100 may be the same, and specifically may be silicon, germanium or silicon germanium, and the semiconductor doping layer 101 and the substrate 100 may be formed from the same initial substrate, the semiconductor doping layer 101 and the substrate 100 have an integrated structure, thereby improving the interface performance between the substrate 100 and the semiconductor doping layer 101, which is beneficial to improving interface state defects, and further improving the electrical performance of the semiconductor structure. In other embodiments, the material of the semiconductor doping layer and the material of the semiconductor channel may be different.

In other embodiments, the material of the semiconductor doping layer and the material of the bit line and the material of the substrate can be the same, so that the semiconductor doping layer, the bit line and the substrate can be formed from the same initial substrate, and the semiconductor doping layer can be formed from the same initial substrate, the bit line and the substrate are integrated into a structure, thereby improving the interface performance between the bit line and the semiconductor doping layer, which is beneficial to improving the interface state defects, and further improve the electrical performance of the semiconductor structure.

In some embodiments, the material of the isolation layer 120 includes, but is not limited to, any one or more of silicon oxide, silicon nitride, or silicon oxynitride; the isolation layer 120 may be a single-layer structure or a stacked-layer structure.

In some embodiments, the word lines 130 include spaced word lines; the material of the word lines 130 includes, but is not limited to, one or more of polysilicon, titanium nitride, tantalum nitride, copper, tungsten, or aluminum. The word line 130 can be a single-layer structure or a laminated structure; the word line dielectric layer 131 is used to isolate the word line 130 from the semiconductor channel 110 to form electrical insulation; the material of the word line dielectric layer 131 includes but is not limited to silicon oxide, nitrogen, one or more of silicon nitride or silicon oxynitride; the word line dielectric layer 131 may be a single-layer structure or a stacked-layer structure.

In some embodiments, the bottom surface of the word line 130 is higher than the top surface of the bit line 104, that is, there is an isolation layer 120 between the word line 130 and the bit line 104, which can ensure that the word line 130 and the bit line 104 are electrically insulated, at the same time, leakage current and capacitance effects can be avoided, which is beneficial to improving the stability of the semiconductor structure.

In some embodiments, the semiconductor structure further includes: a first isolation layer (not shown in the figure), the first isolation layer is located between adjacent word lines 130; a second isolation layer 142, the second isolation layer 142 is located on the word line 130 and on the first isolation layer, and the second isolation layer 142 is also located on the side of the semiconductor channel 110 away from the word line 130.

In some embodiments, the first isolation layer and the second isolation layer 142 are integrally formed, on the one hand, the process flow can be simplified; on the other hand, the interface between the first isolation layer 141 and the second isolation layer 142 can be improved performance, which is conducive to improving interface state defects, and further improving the electrical properties of the semiconductor structure; the materials of the first isolation layer and the second isolation layer 142 include but are not limited to one or more of silicon oxide, silicon nitride or silicon oxynitride; the first isolation layer and the second isolation layer 142 may be a single-layer structure or a stacked-layer structure.

In the technical solution of the semiconductor structure provided by the embodiment of the present disclosure, the semiconductor channel 110 is located on the bit line 104 and the semiconductor doping layer 101 is located on the side of the bit line 104 to increase the contact between the bit line structure and the active structure. It is beneficial to improvinging the problem of weak electrical conductivity between the bit line structure and the active structure, thereby improving the stability of the semiconductor structure; the word line 130 surrounds part of the semiconductor channel 110, that is, the semiconductor structure is a GAA structure, and the GAA structure can be The realization of the four-sided wrapping of the gate to the channel region of the semiconductor can largely solve the problems of leakage current, capacitance effect and short channel effect caused by the reduction of the gate spacing size, and reduce the vertical direction of the word line 130. The occupied area is beneficial to enhancing the gate control performance and improve the integration degree of the semiconductor structure.

In addition, in the first direction, the bit line 104 has at least two rows of semiconductor channels 110 arranged at intervals, which is beneficial to enhancing the electrical contact performance between the bit line 104 and the semiconductor channel 110, and further improve the stability of the semiconductor structure.

Another embodiment of the present disclosure also provides a semiconductor structure, the semiconductor structure provided by another embodiment of the present disclosure is substantially the same as the semiconductor structure provided by the previous embodiment, the main difference includes at least two bit lines, a semiconductor doping layer on one side of the bit line.

Figure 3:
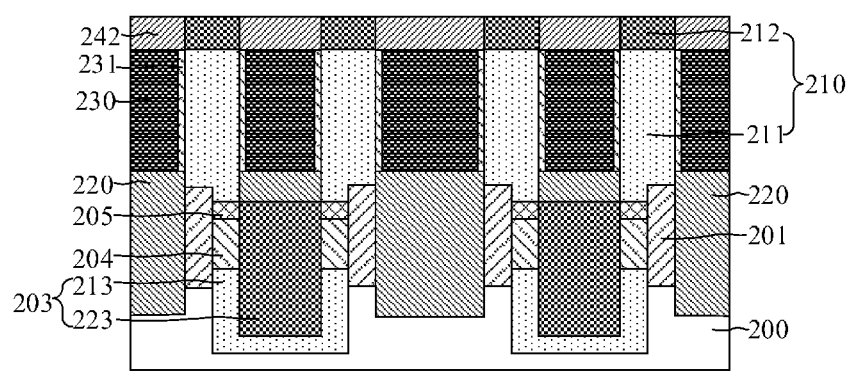
FIG. 3 is a schematic structural diagram of a semiconductor structure provided by another embodiment of the present disclosure.

FIG. 3 is a schematic structural diagram of a semiconductor structure provided by another embodiment of the present disclosure. The semiconductor structure provided by another embodiment of the present disclosure will be described in detail below with reference to FIG. 3, which will not be described in detail below.

FIG. 3, the semiconductor structure includes: a substrate 200 with a bit line 204 extending in a first direction on the substrate; a semiconductor channel 210, the semiconductor channel 210 is located on the bit line 204; a semiconductor doping layer 201, a semiconductor doping layer 201 is located on the side of the bit line 204, and the top surface of the semiconductor doping layer 201 is in contact with the semiconductor channel 210; the word line 230 extending along the second direction, the word line 230 surrounds part of the semiconductor channel 210, and the bottom surface of the word line 230 is higher than the bit line 230. Top surface of line 204; word line dielectric layer 231, word line dielectric layer 231 between word line 230 and semiconductor channel 210; isolation layer 220, isolation layer 220 between word line 230 and bit line 204 and word line 230 and between the semiconductor doping layers 201.

In some embodiments, there are at least two bit lines 204, the semiconductor doping layer 201 is located on one side of the bit line 204, and the semiconductor doping layers 201 of the two adjacent bit lines 204 are located on different sides; the isolation layer 220 It is also located on the top surface of the barrier layer 203 exposed by the semiconductor channel 210, and the isolation layer 220 is located between the word line 230 and the barrier layer 203; the word line 230 is located on the top surface of the barrier layer 203 exposed by the semiconductor channel 110.

In the technical solution of the semiconductor structure provided by the embodiment of the present disclosure, the semiconductor channel 210 is located on the bit line 204 and the semiconductor doping layer 201 is located on the side of the bit line 204 to increase the contact between the bit line structure and the active structure, it is beneficial to improving the problem of weak conductivity between the bit line structure and the active structure, thereby improving the stability of the semiconductor structure; the word line 230 surrounds part of the semiconductor channel 210, that is, the semiconductor structure is a GAA structure, and the GAA structure can the realization of the four-sided wrapping of the gate to the channel region of the semiconductor can largely solve the problems of leakage current, capacitance effect and short channel effect caused by the reduction of the gate spacing size, and reduce the vertical direction of the word line 230. The occupied area is beneficial to enhance the gate control performance and improve the integration degree of the semiconductor structure.

Accordingly, an embodiment of the present invention provides a method for fabricating a semiconductor structure, which can be used to form the above-mentioned semiconductor structure.

FIGS. 4 to 14 are schematic structural diagrams corresponding to each step in a method for manufacturing a semiconductor structure provided by an embodiment of the present invention, and FIGS. 15 to 24 are each step in a method for manufacturing a semiconductor structure provided by an embodiment of the present invention. Corresponding to the top view, the manufacturing method of the semiconductor structure provided in this embodiment will be described in detail below with reference to the accompanying drawings.

FIGS. 4 to 9 and FIGS. 15 to 19, a substrate 100 is provided, and the substrate 100 has a bit line 104 extending in the first direction; a semiconductor doping layer 101 and a semiconductor channel 110 are formed, and the semiconductor channel 110 is located in the position On the line 104, the semiconductor doping layer 101 is located on the side of the bit line 104, and the top surface of the semiconductor doping layer 101 is in contact with the semiconductor channel 110.

Specifically, the process steps of forming the semiconductor doping layer 101 and the semiconductor channel 110 include: providing a stacked initial semiconductor substrate 108 and a first doping layer 109, and the first doping layer 109 is doped with N-type ions or P-type ions, and the first doping layer 109 has a bit line 104; a semiconductor layer is formed on the top surface of the first doping layer 109 and the bit line 104; the semiconductor layer and the first doping layer 109 are patterned, and the rest The semiconductor layer serves as the semiconductor channel 110, and the remaining first doping layer 109 serves as the semiconductor doping layer 101.

Figure 4:
FIGS. 4 to 14 are schematic structural diagrams corresponding to each step in a method for forming the semiconductor structure provided by an embodiment of the present disclosure.

More specifically, referring to FIG. 4, an initial semiconductor substrate is provided, a partial thickness of the initial semiconductor substrate is subjected to doping treatment, and the doping ions of the doping treatment are N-type ions or P-type ions, then the initial semiconductor substrate of a partial thickness is doped. The semiconductor substrate is used as the first doping layer 109, and the initial semiconductor substrate other than the first doping layer 109 is used as the initial semiconductor substrate 108.

In some embodiments, the material of the initial semiconductor substrate is a semiconductor material. Specifically, le semiconductor material may be any one of silicon, germanium, silicon germanium or silicon carbide.

In some embodiments, the doping treatment is to make dopant ions in the first doping layer 109 through an ion implantation process, wherein the dopant ions are N-type ions or P-type ions, and the N-type ions may specifically be Phosphorus ion, arsenic ion or antimony ion, P-type ion can be boron ion, indium ion or boron fluoride ion.

Figure 5:
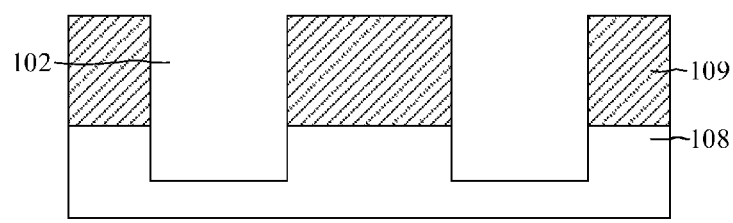
Figure 15:
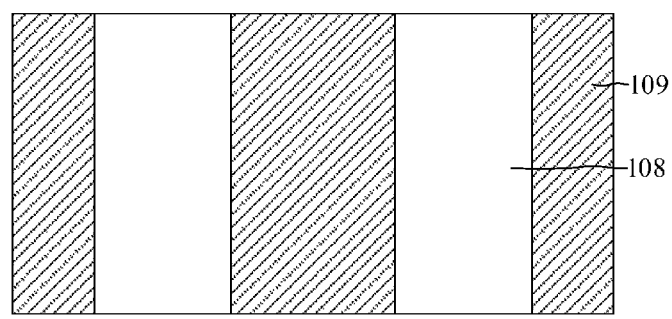
FIGS. 15 to 24 are top views corresponding to each step in a method for forming the semiconductor structure provided by an embodiment of the present disclosure.

FIGS. 5 and 15, the first doping layer 109 and the initial semiconductor substrate 108 are patterned, and the first trench 102 is formed in the initial semiconductor substrate 108. The sidewall of the first trench 102 exposes part of the side surface of the initial semiconductor substrate 108, on the one hand, ions in the subsequently formed bit line can be prevented from diffusing into the initial semiconductor substrate 108, thereby reducing the concentration of ions in the bit line, and further it is beneficial to improving the electrical conductivity of the bit line; on the other hand, it can ensure that the area of the subsequently formed bit line structure is increased, thereby improving the electrical conductivity of the bit line. In other embodiments, the first doping layer is patterned to form a first trench, and the bottom of the first trench exposes the surface of the initial semiconductor substrate.

In some embodiments, the width of the first trench 102 is 2 times to 3.5 times the maximum width of the subsequently formed semiconductor channel in a direction parallel to the extension direction of the subsequently formed word line, specifically, 2 times, 2.8 times, 3.3 times or 3.5 times. The subsequently formed bit line is located in the first trench 102, which is equivalent to the width of the first trench 102 being equal to the width of the subsequently formed bit line. In the subsequently formed semiconductor structure, the width of the bit line is less than 2 times the maximum width of the semiconductor channel. times, the width of the word line between adjacent semiconductor channels is smaller, because the word line does not have enough area to play a role, thereby reducing the control ability of the word line; the width of the bit line is greater than 3.5 times the maximum width of the semiconductor channel, which is equivalent to increasing the width of the semiconductor structure in the second direction, thereby reducing the integration degree of the semiconductor device.

Figure 6:
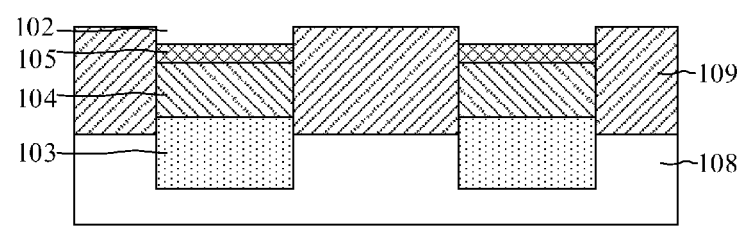
Figure 16:
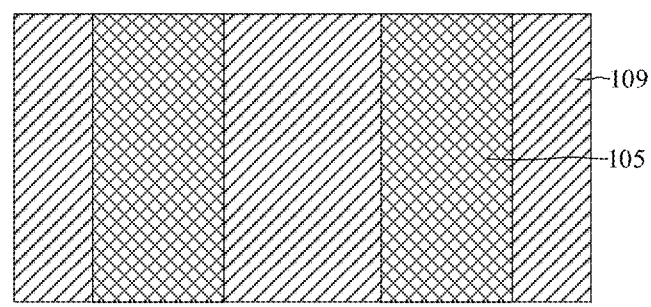

FIGS. 6 and 16, the stacked barrier layer 103, the bit line 104 and the dielectric layer 105 are sequentially formed on the initial semiconductor substrate 108, and the stacked barrier layer 103, the bit line 104 and the dielectric layer 105 are also located in the first inside the trench 102.

In some embodiments, the barrier layer 103 blocks the diffusion of ions between the bit line 104 and the initial semiconductor substrate 108, the ions include dopant ions or metal ions, and the bottom surface of the bit line 104 in contact with the barrier layer 103 is higher than the top surface of the initial semiconductor substrate 108 in contact with the first doping layer 109. Metal ions or doping ions of the bit line 104 can be effectively prevented from diffusing into the initial semiconductor substrate 108, which increases conductivity between the bit line 104 and the first doping layer 109. The material of the barrier layer 103 is silicon nitride. In other embodiments, the bottom surface of the bit line in contact with the barrier layer is flush with the top surface of the initial semiconductor substrate in contact with the first doping layer; the material of the barrier layer can be silicon dioxide or other materials with high dielectric constant.

In some embodiments, along the extension direction of the subsequently formed word line, the opposite sides of the bit line 104 have the first doping layer 109, which increases the contact area between the bit line 104 and the first doping layer 109, is beneficial to improving the problem that the electrical conductivity between the bit line structure and the active structure is weak, and is further beneficial to improve the stability of the semiconductor structure.

In some embodiments, the material of the bit line 104 includes a metal, and the metal can be cobalt, nickel, molybdenum, titanium, tungsten, tantalum or platinum. The contact resistance of the impurity layer 109 effectively avoids the problem of leakage current, and it is beneficial to improving the conductivity of the bit line 104 and the semiconductor doping layer 101; the bit line 104 can be a single-layer structure or a stacked-layer structure. In other embodiments, the material of the bit line is the same as the material of the substrate, and the bit line has doping ions of the same type as the doping ions in the semiconductor doping layer, and the doping ions are used as carriers, which can improve the bit line The migration and diffusion between the inner and the first doping layer, is beneficial to improving the conductivity of the bit line and the first doping layer, and the material of the bit line is the same as that of the substrate. The line and the initial semiconductor substrate can be formed from the same initial substrate, and the first doping layer, the bit line and the initial semiconductor substrate are integrated into one structure, thereby improving the interface performance between the bit line and the first doping layer, which is beneficial to improving the interface state defects, thereby further improving the electrical properties of the semiconductor structure; on the other hand, the process flow can be simplified.

In some embodiments, the surface of the dielectric layer 105 is lower than the surface of the first doping layer 109, which effectively avoids the phenomenon that the subsequent formation of the semiconductor channel has lattice defects, thereby helping to improve the conductivity of the semiconductor channel; the dielectric layer 105 is used to prevent the diffusion of metal ions in the bit line 104. The dielectric layer 105 can also be regarded as a part of the bit line 104. The material of the dielectric layer 105 can include, but is not limited to, any one of titanium nitride or other nitrogen-containing metal materials. In some other embodiments, the surface of the dielectric layer is flush with the surface of the first doping layer, on the one hand, the area of the bit line can be increased, and on the other hand, the contact area between the first doping layer and the bit line can be increased, It is beneficial to improving the conductivity of the bit line, and is further beneficial to improving the conductivity of the semiconductor structure.

Figure 7:
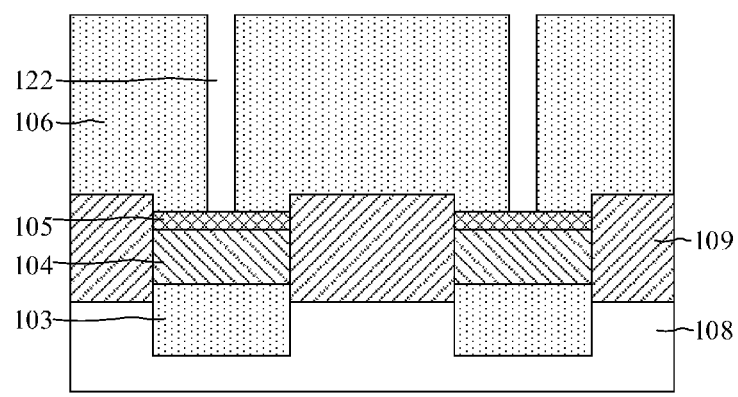
Figure 17:
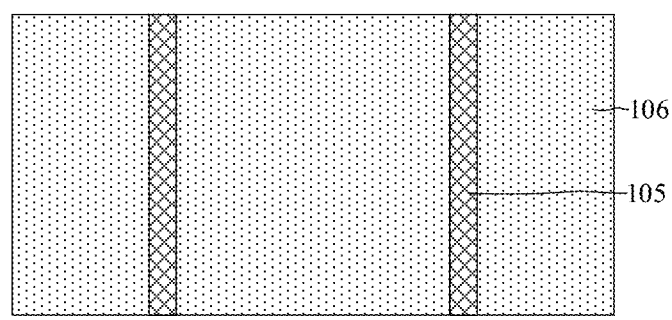

Referring to FIG. 7 and FIG. 17, a selective epitaxy process is used to form the second doping layer 106, and the second doping layer 106 has a trench 122 therein.

In some embodiments, the second doping layer 106 is a semiconductor layer, the second doping layer 106 contains doping ions, and the type of doping ions in the second doping layer 106 is the same as that of the first doping layer 109. The types of inner doping ions are different, that is, the semiconductor structure formed by the second doping layer 106 and the first doping layer 109 is a junction transistor, and the "junction" here refers to a PN junction, that is, the semiconductor structure formed subsequently. The transistor formed by the channel has a PN junction, which is a device with majority carriers as a conductive device, so it can avoid the problem of minority carrier storage and diffusion, and the majority carrier speed is high, which is beneficial to improving the conductivity of the semiconductor channel. In other embodiments, the type of doping ions in the second doping layer is the same as the type of doping ions in the first doping layer, that is, the semiconductor structure formed by the second doping layer and the first doping layer is no Junction transistor, "junctionless" here refers to no PN junction, that is, there is no PN junction in the transistor formed by the semiconductor channel. On the one hand, there is no need to perform additional doping on the doped region, thus avoiding the problem that the doping process of the doped region is difficult to control, especially as the transistor size is further reduced, if the doped region is additionally doped, the Impurity concentration is more difficult to control; on the other hand, because the device is a junctionless transistor, it is beneficial to avoid the phenomenon of ultra-steep source-drain concentration gradient doping process and the formation of ultra-steep PN junctions in the nanoscale range, thus avoiding doping mutation The resulting problems such as threshold voltage drift and leakage current increase are beneficial to suppress the short-channel effect, and can still work in the scale of several nanometers, thus helping to further improve the integration density and electrical performance of semiconductor structures.

In some embodiments, in the process step of forming the second doping layer 106, N-type ions are doped in-situ. In other embodiments, in the process step of forming the second doping layer, P-type ions are doped in-situ.

In some embodiments, the source material used in the selective epitaxial growth process includes a source gas, an etching gas hydrogen chloride and a dopant ion source gas, the dopant ion source gas is used to provide dopant ions, and the silicon source gas may specifically be silane, disilane, dichlorosilane or trichlorosilane. In other embodiments, the source gas may also be a germanium source gas, and the germanium source gas may specifically be germane.

In some embodiments, the doping ion source gas is an N-type ion source gas, and the N-type ion source gas may specifically be phosphorane, arsine or antimony hydride. In other embodiments, the doping ion source gas is a P-type ion source gas, and the P-type ion source gas may specifically be borane, boron trifluoride or diborane.

In some embodiments, the material of the second doping layer 106 is the same as the material of the initial semiconductor substrate 108, which may be silicon, germanium or silicon germanium. On the one hand, the process flow can be simplified; on the other hand. If the materials are the same, the lattice mismatch factor is 0, which effectively avoids the problems of lattice defects and increased internal resistance in the second doping layer 106, and is beneficial to improving the conductivity of the second doping layer 106. In other embodiments, the material of the second doping layer may be different from the material of the initial semiconductor substrate.

Figure 8:
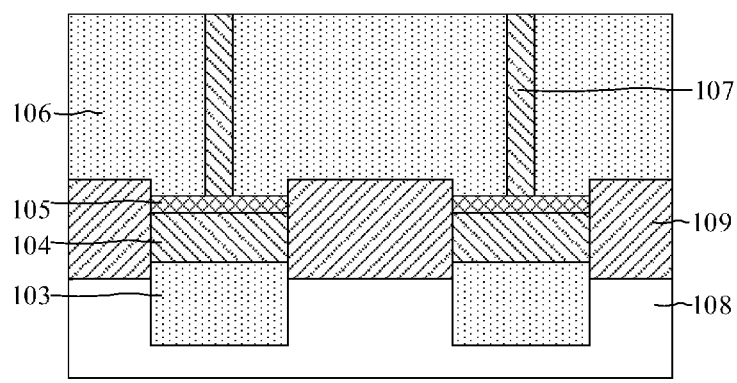
Figure 18:
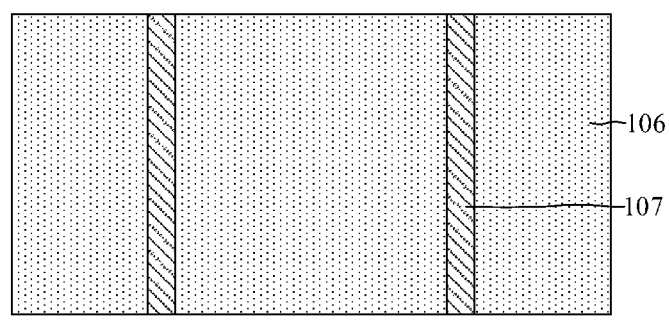

FIGS. 8 and 18, a sacrificial layer 107 is formed, and the sacrificial layer 107 fills the trenches 122.

Figure 9:
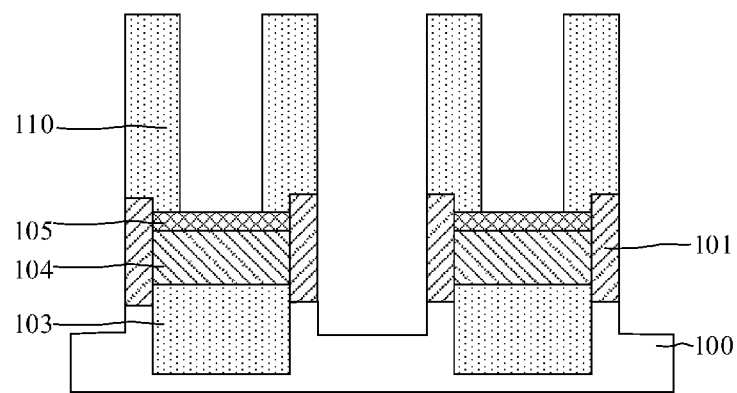
Figure 19:
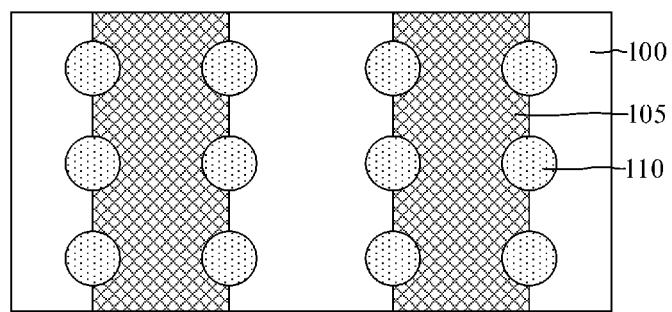

FIGS. 9 and 19, the second doping layer 106, the first doping layer 109 and the initial semiconductor substrate 108 are patterned, the remaining second doping layer 106 is used as the semiconductor channel 110, and the remaining first doping layer 109 is used as the semiconductor doping layer 101, the remaining initial semiconductor substrate 108 is used as the base 100, and the sacrificial layer 107 is removed.

In some embodiments, in the first direction, the bit line 104 has at least two rows of semiconductor channels 110 arranged at intervals, the subsequently formed word line surrounds part of the semiconductor channel 110, and the semiconductor doping layer 101 is located on the bit line. On both sides of 104, the contact area between the bit line 104 and the semiconductor doping layer 101 is increased, which is beneficial to improving the problem of weak conductivity between the bit line structure and the active structure, and further helps to improve the stability of the semiconductor structure.

In some embodiments, parallel to the second direction, the maximum width of the semiconductor channel 110 ranges from 10 nm to 20 nm, specifically 10 nm, 13 nm, 15 nm or 20 nm; the positive width of the projected area of the bit line 104 on the substrate 100 ranges from 0.5 times to 0.8 times of the orthographic projected area of the semiconductor channel 110 on the substrate 100, specifically 0.5 times, 0.6 times, 0.7 times or 0.8 times, which ensures the contact area between the bit line 104 and the semiconductor channel 110. It is beneficial to improving the prior weak electrical conductivity between the bit line structure and the active structure, and is further beneficial to improve the stability of the semiconductor structure.

Figure 10:
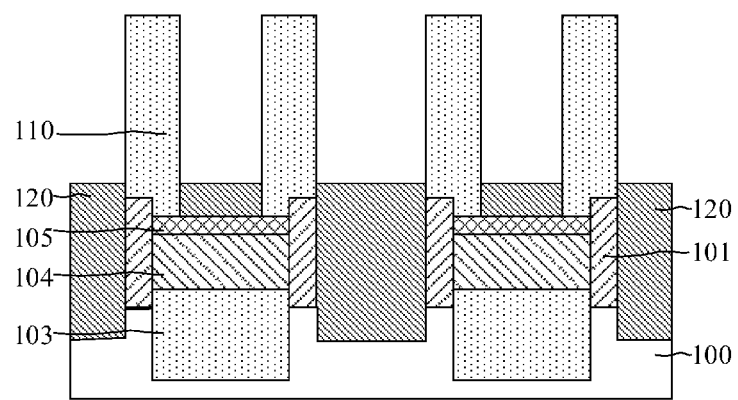
Figure 20:
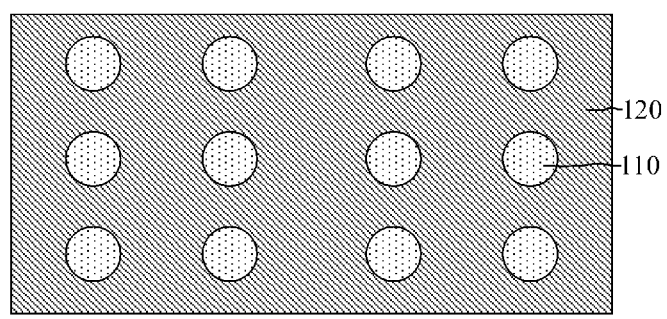

FIG. 10 and FIG. 20, an isolation layer 120 is formed, the isolation layer 120 is located on the side of the bit line 104 and the side of the semiconductor doping layer 101 away from the bit line 104.

In some embodiments, the material of the isolation layer 120 includes, but is not limited to, any one or more of silicon oxide, silicon nitride, or silicon oxynitride; the isolation layer 120 may be a single-layer structure or a stacked-layer structure.

In FIGS. 11, 12 and 21, 22, the word line 130 and the word line dielectric layer 131 extending along the second direction are formed, the word line 130 and the word line dielectric layer 131 are located on the isolation layer 120, and the word line 130 surrounds a portion of the semiconductor channel 110, the bottom surface of the word line 130 is higher than the top surface of the bit line 104, and the word line dielectric layer 131 is located between the word line 130 and the semiconductor channel 110.

Figure 11:
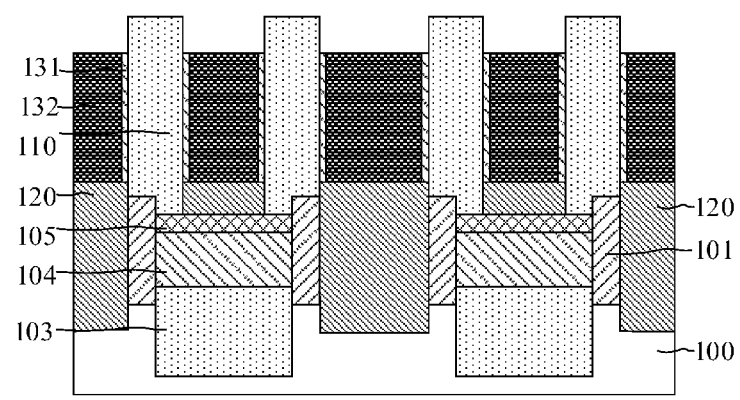
Figure 21:
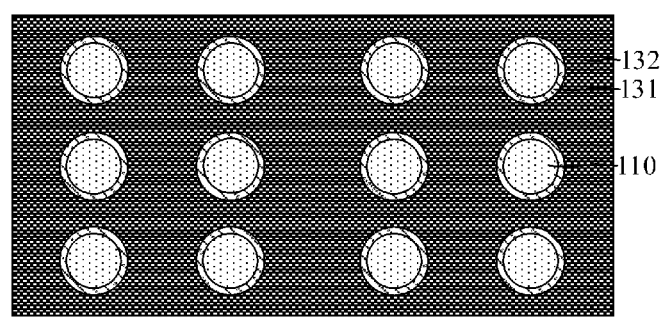

Specifically, referring to FIG. 11 and FIG. 21, a word line dielectric layer 131 and a gate conductive layer 132 are formed on the isolation layer 120, and the word line dielectric layer 131 is located on the side of the semiconductor channel 110 with a partial thickness and surrounds the semiconductor channel 110; the conductive layer 132 is located on the side of the gate dielectric layer 131 corresponding to the semiconductor channel 110 with a partial thickness and surrounds the gate dielectric layer 131.

In some embodiments, the material of the gate conductive layer 132 includes but is not limited to one or more of polysilicon, titanium nitride, tantalum nitride, copper, tungsten or aluminum; the gate conductive layer 132 may be a single layer structure or stack structure; the word line dielectric layer 131 is used to isolate the word line 130 from the semiconductor channel 110 to form electrical insulation; the material of the word line dielectric layer 131 includes but is not limited to one of silicon oxide, silicon nitride or silicon oxynitride. one or more; the word line dielectric layer 131 may be a single-layer structure or a stacked-layer structure.

Figure 12:
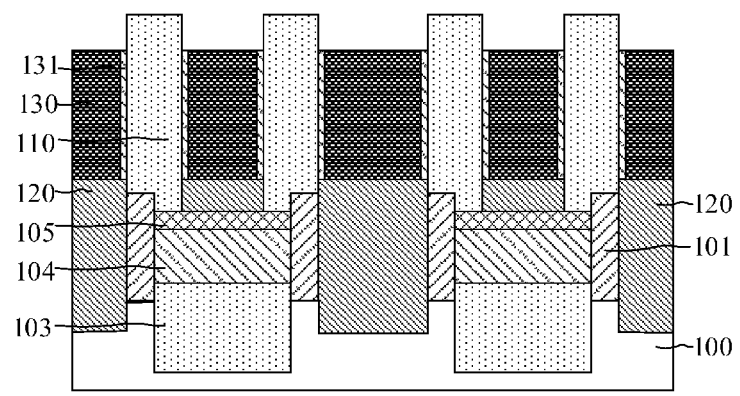
Figure 22:
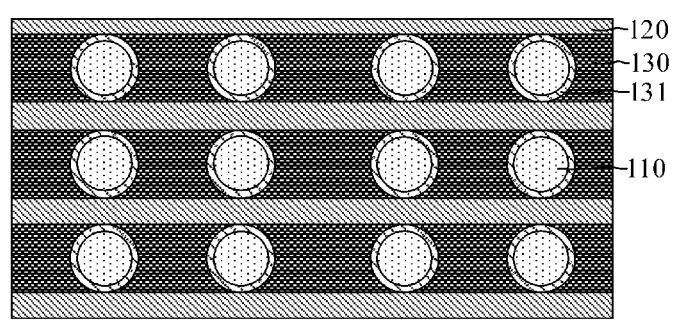

FIG. 12 and FIG. 22, the gate conductive layer 132 is patterned, and the remaining gate conductive layer 132 is used as the word line 130.

In some embodiments, the bottom surface of the word line 130 is higher than the top surface of the bit line 104, that is, there is an isolation layer 120 between the word line 130 and the bit line 104, which can ensure that the word line 130 and the bit line 104 are electrically insulated at the same time, leakage current and capacitance effect can be avoided, which is beneficial to improving the stability of the semiconductor structure.

In other embodiments, a substrate is provided, and the substrate has a bit line extending along the first direction; a semiconductor doping layer and an isolation layer are sequentially formed on the substrate, the semiconductor doping layer is located on the side of the bit line, and the isolation layer Also located on the bit line; forming a word line and a word line dielectric layer extending along the second direction, the word line and the word line dielectric layer are located on the isolation layer, the word line surrounds the word line dielectric layer, and the bottom surface of the word line is higher than the top surface of the bit line; forming a second trench, the sidewall of the second trench exposes the word line dielectric layer and the isolation layer, and the bottom of the second trench exposes the semiconductor doping layer and the bit line; forming a semiconductor channel, the semiconductor channel is located in the first In the two trenches, the semiconductor channel is located on the bit line, and the top surface of the semiconductor doping layer is in contact with the semiconductor channel.

Figure 13:
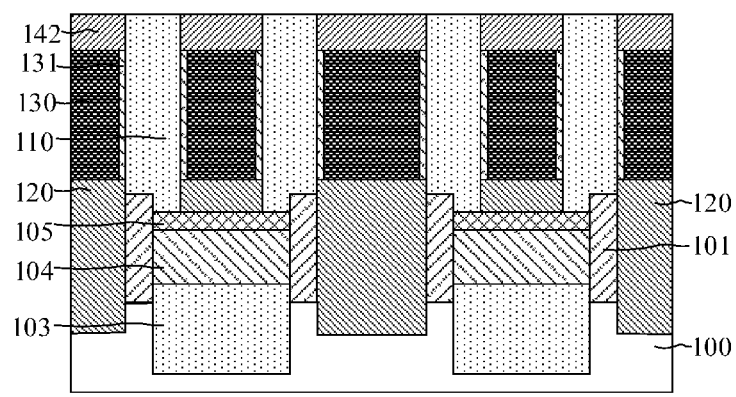
Figure 23:
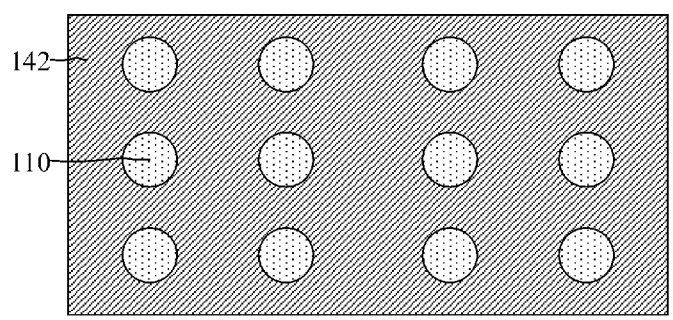

In FIGS. 13 and 23, a first isolation layer (not shown in the figure) and a second isolation layer 142 are formed, the first isolation layer is located between adjacent word lines 130; the second isolation layer 142 is located in the word line 130 and on the first isolation layer, and the second isolation layer 142 is also located on the side of the semiconductor channel 110 away from the word line 130.

In some embodiments, the first isolation layer and the second isolation layer 142 are integrally formed. On the one hand, the process flow can be simplified; on the other hand, the interface performance between the first isolation layer and the second isolation layer 142 can be improved, which is beneficial to improving the interface state defects and further improve the electrical properties of the semiconductor structure; the materials of the first isolation layer and the second isolation layer 142 include but are not limited to one or more of silicon oxide, silicon nitride or silicon oxynitride; the first isolation layer and the second isolation layer 142 may be a single-layer structure or a stacked-layer structure.

Figure 14:
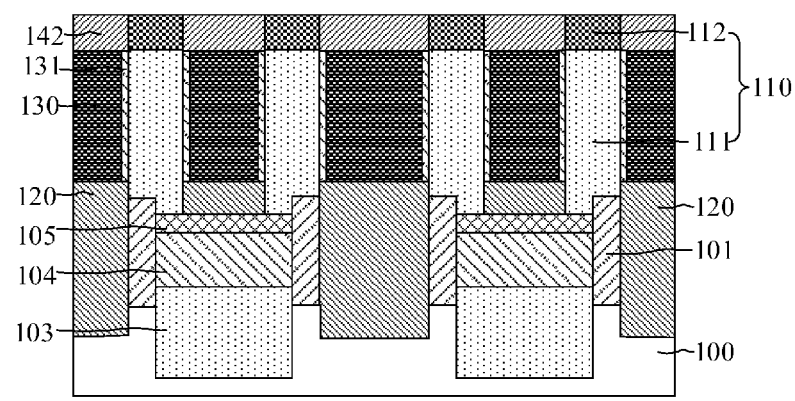
Figure 24:
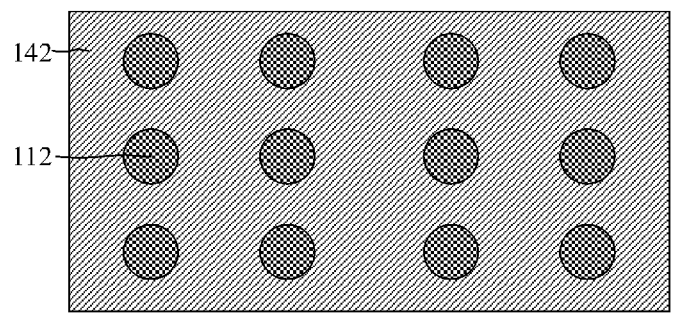

FIG. 14 and FIG. 24, the semiconductor channel 110 higher than the top surface of the word line 130 is subjected to doping treatment, and the type of doping ions in the doping treatment is the same as the type of doping ions in the semiconductor doping layer 101 same.

In some embodiments, the semiconductor channel 110 includes: a channel region 111, the region of the semiconductor channel 110 opposite to the word line 130 is used as the channel region 111, and the channel region 111 is doped with N-type ions or P doping region 112, the region of the semiconductor channel 110 other than the channel region 111 is used as the doping region 112, and the doping ions in the doping region 112 are of the same type as the doping ions in the semiconductor doping layer 101.

In some embodiments, the type of dopant ions in the channel region 111 is different from the type of dopant ions in the semiconductor doping layer 101, which is equivalent to a junction transistor, where "junction" refers to a PN junction, that is, the transistor composed of the semiconductor channel 110 has a PN junction, which is a device where the majority carriers are used as conductive devices, so it can avoid the problems of minority carrier storage and diffusion, and the majority carrier speed is high, which is conducive to improving conductivity of the semiconductor channel 110.

In other embodiments, the type of doping ions in the channel region is the same as the type of doping ions in the semiconductor doping layer, which is equivalent to the semiconductor structure being a junctionless transistor, where "junctionless" refers to a situation with no PN junction, that is, there is no PN junction in the transistor formed by the semiconductor channel. On the one hand, there is no need to perform additional doping on the doped region, thus avoiding the problem that the doping process of the doped region is difficult to control, especially as the transistor size is further reduced, if the doped region is additionally doped, the impurity concentration is more difficult to control; on the other hand, because the device is a junctionless transistor, it is beneficial to avoid the phenomenon of ultra-steep source-drain concentration gradient doping process and the formation of ultra-steep PN junctions in the nanoscale range, thus avoiding doping mutation and the resulting problems such as threshold voltage drift and leakage current increase, thus are beneficial to suppressing the short-channel effect, and can still work in the scale of several nanometers, thus helping to further improve the integration density and electrical performance of semiconductor structures.

In some embodiments, the doping ions are N-type ions or P-type ions, and the N-type ions can specifically be phosphorus ions, arsenic ions or antimony ions, and the P-type ions can specifically be boron ions, indium ions, or boron fluoride ions.

In the technical solution of the semiconductor structure provided by the embodiment of the present disclosure, the semiconductor channel 110 is located on the bit line 104 and the semiconductor doping layer 101 is located on the side of the bit line 104 to increase the contact between the bit line structure and the active structure. It is beneficial to improving the problem of weak electrical conductivity between the bit line structure and the active structure, thereby improving the stability UI the semiconductor structure; the word line 130 surrounds part of the semiconductor channel 110, that is, the semiconductor structure is a GAA structure, and the GAA structure can be The realization of the four-sided wrapping of the gate to the channel region of the semiconductor can largely solve the problems of leakage current, capacitance effect and short channel effect caused by the reduction of the gate pitch size, and reduce the vertical direction of the word line 110. The occupied area is beneficial to enhance the gate control performance and improve the integration degree of the semiconductor structure.

In addition, in the first direction, the bit line has at least two rows of semiconductor channels arranged at intervals, which is beneficial to enhance the control performance of the bit line; since the word line surrounds part of the semiconductor channel, it is equivalent to two word lines consisting of the same The bit line control can enhance the control ability of the bit line to the word line and further improve the stability of the semiconductor structure.

FIGS. 25 to 36 are schematic structural diagrams corresponding to each step in a method for preparing a semiconductor structure provided by another embodiment of the present disclosure, and FIGS. 37 to 49 are schematic structural diagrams related to each step if a method for preparing a semiconductor structure provided by another embodiment of the present disclosure. The top view corresponding to each step is the same as or corresponding to the above-mentioned embodiment, and thus top views will not be described in details below.

FIGS. 25 to 33 and FIGS. 37 to 44, a substrate 200 is provided, the substrate 200 has a bit line 204 extending in the first direction, a semiconductor doping layer 201 and a semiconductor channel 210 are formed, and the semiconductor channel 210 is located in the position on the bit line 204, the semiconductor doping layer 201 is located on the side of the bit line 204, and the top surface of the semiconductor doping layer 201 is in contact with the semiconductor channel 210.

Specifically, the process steps of forming the semiconductor doping layer 201 and the semiconductor channel 210 include: providing a stacked initial semiconductor substrate 208 and a first doping layer 209, and the first doping layer 209 is doped with N-type ions or P-type ions, and the first doping layer 209 has a bit line 204; a semiconductor layer is formed on the top surface of the first doping layer 209 and the bit line 204; the semiconductor layer and the first doping layer 209 are patterned, and the rest of the semiconductor layer serves as the semiconductor channel 210, and the remaining first doping layer 209 serves as the semiconductor doping layer 201.

Figure 25:
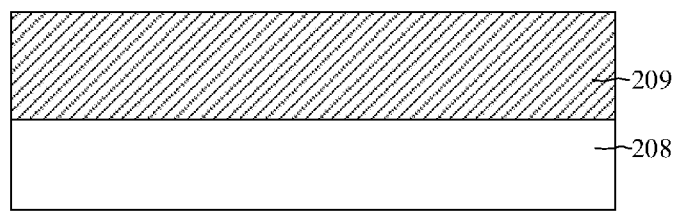
FIGS. 25 to 36 are schematic structural diagrams corresponding to each step in a method for forming the semiconductor structure provided by another embodiment of the present disclosure.

Referring to FIG. 25, an initial semiconductor substrate is provided, and a partial thickness of the initial semiconductor substrate is subjected to doping treatment, and the doping ions of the doping treatment are N-type ions or P-type ions, then the partial thickness of the initial semiconductor substrate is used as the first semiconductor substrate. A doping layer 209, the initial semiconductor substrate other than the first doping layer 209 is used as the initial semiconductor substrate 208.

Figure 26:
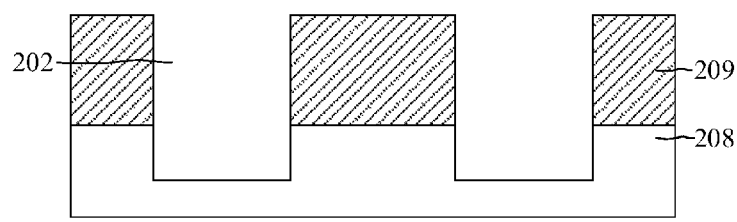
Figure 37:
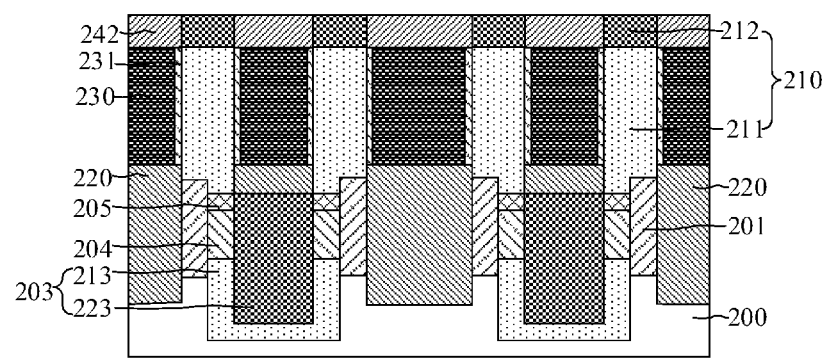
FIG. 37 to FIG. 49 are plan views corresponding to each step in a method for forming the semiconductor structure provided by another embodiment of the present disclosure.

FIGS. 26 and 37, the first doping layer 209 and the initial semiconductor substrate 208 are patterned, and the first trench 202 is formed in the initial semiconductor substrate 208.

Figure 27:
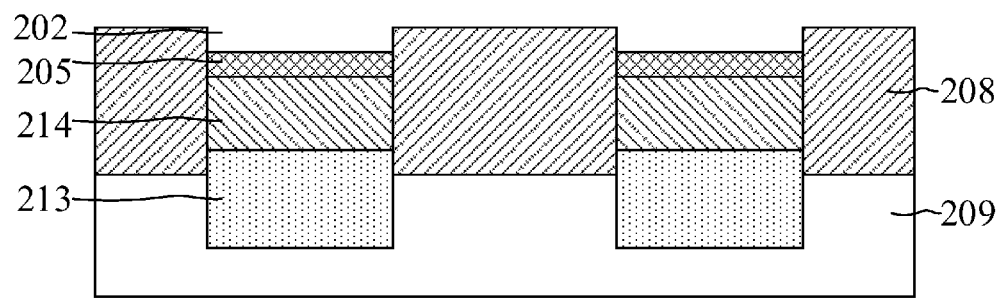
Figure 38:
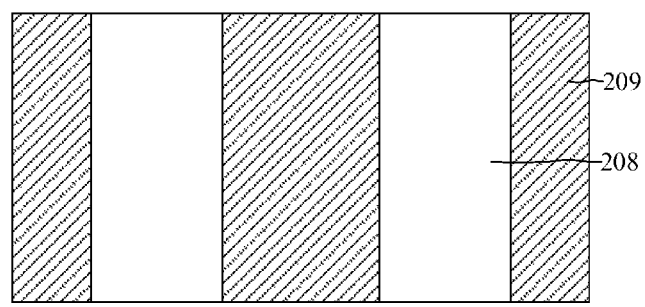

Referring to FIG. 27 and FIG. 38, a stacked first barrier layer 213, a conductive layer 214 and a dielectric layer 205 are sequentially formed on the initial semiconductor substrate 208, and the stacked first barrier layer 213, the conductive layer 214 and the dielectric layer 205 are also within the first trench 202.

In some embodiments, the material of the conductive layer 214 includes a metal, and the metal may specifically be cobalt, nickel, molybdenum, titanium, tungsten, tantalum or platinum. The resistance of the metal itself is small, which reduces the amount of the conductive layer 214 and the first doping layer. The contact resistance of the impurity layer 209 effectively avoids the problem of leakage current, and is beneficial to improving the conductivity of the conductive layer 214 and the first doping layer 209; and the conductive layer 214 can be a single-layer structure or a stacked-layer structure.

In some embodiments, the first barrier layer 213 is used to block the diffusion of metal ions between the conductive layer 214 and the initial semiconductor substrate 208; the bottom surface of the conductive layer 214 in contact with the first barrier layer 213 is higher than the initial semiconductor substrate. The top surface of the bottom 208 in contact with the first doping layer 209 can effectively prevent the metal ions of the conductive layer 214 from diffusing into the initial semiconductor substrate 208, which is beneficial to improving the conductivity of the conductive layer 214 and the first doping layer 209. The material of the first barrier layer 213 is silicon nitride. In other embodiments, the material of the first barrier layer may be silicon dioxide or other materials with high dielectric constant.

Figure 28:
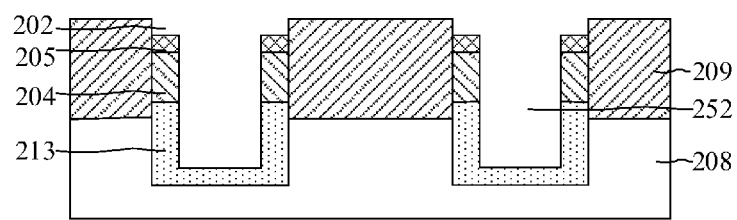
Figure 39:
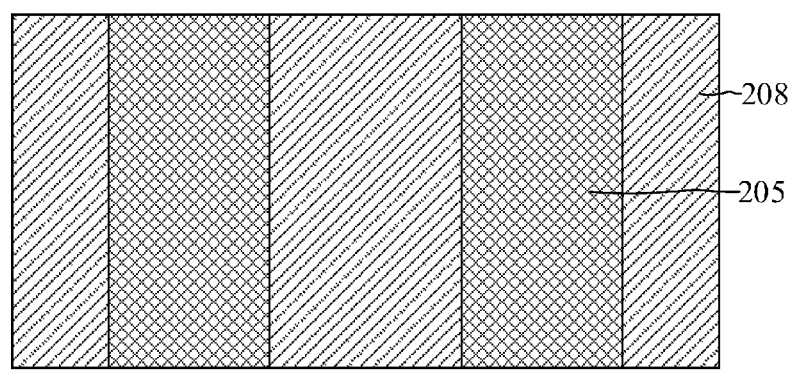

FIG. 28 and FIG. 39, a third trench 252 is formed through the conductive layer 214 and the dielectric layer 205, the first barrier layer 213 is exposed at the bottom of the third trench, and the remaining conductive layer 214 is used as the bit line 104.

In some embodiments, the third trench 252 is located in the first barrier layer 213, so that the conductive layer 214 forms an open circuit, so as to electrically insulate and prevent two adjacent bit lines from forming a via, which is equivalent to forming two transistors. In other embodiments, the bottom surface of the third trench is flush with the top surface of the first barrier layer.

Figure 29:
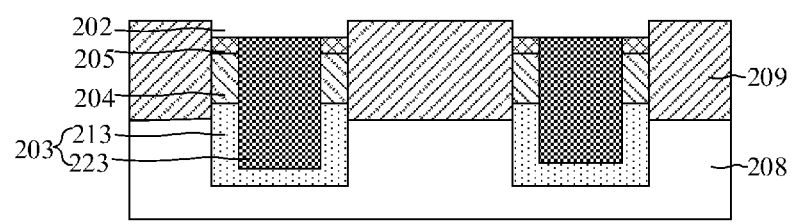
Figure 30:
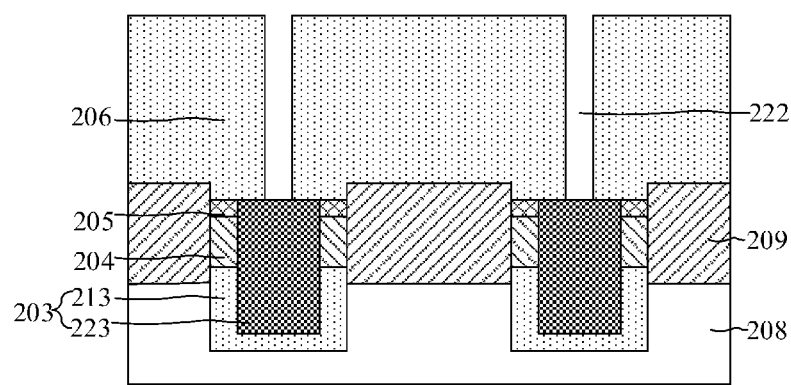
Figure 31:
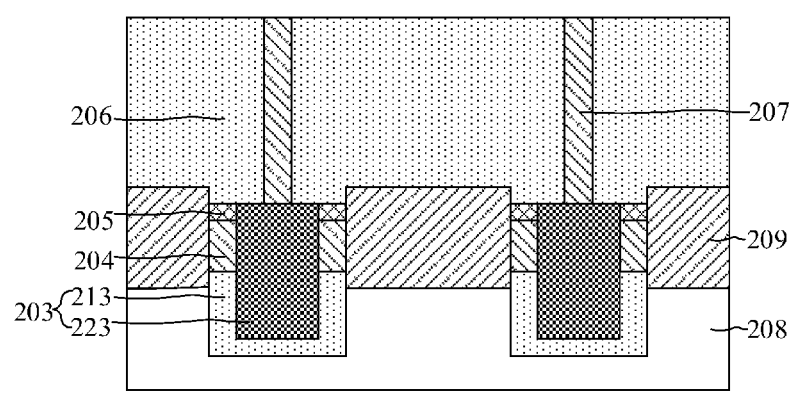
Figure 32:
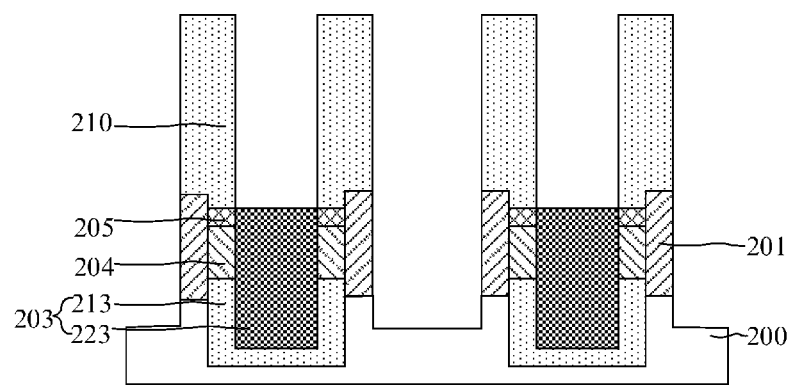
Figure 33:
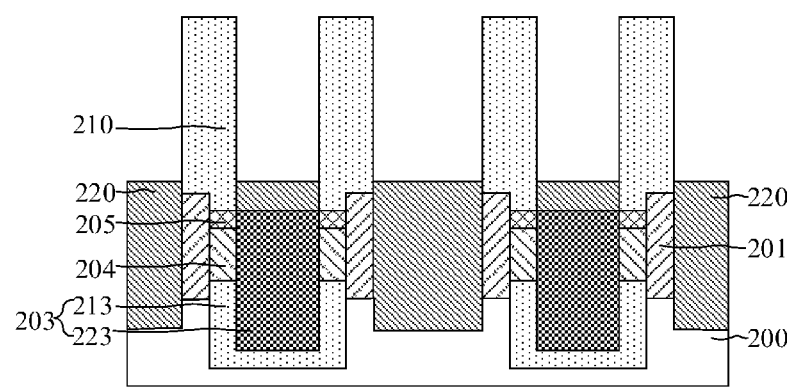
Figure 34:
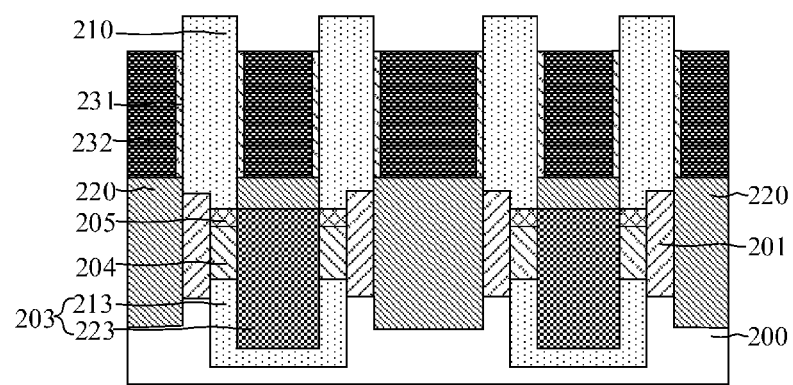
Figure 35:
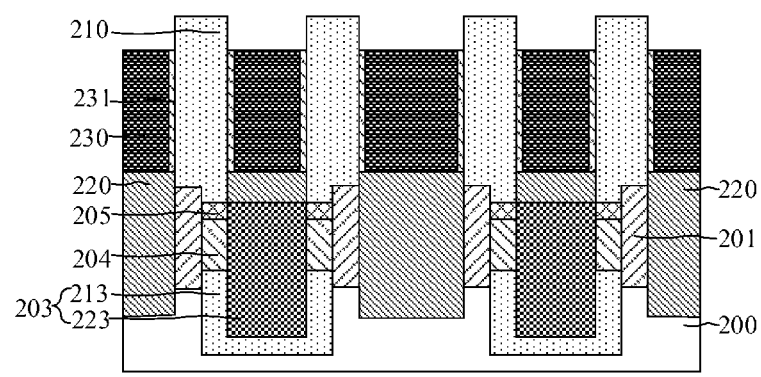
Figure 36:
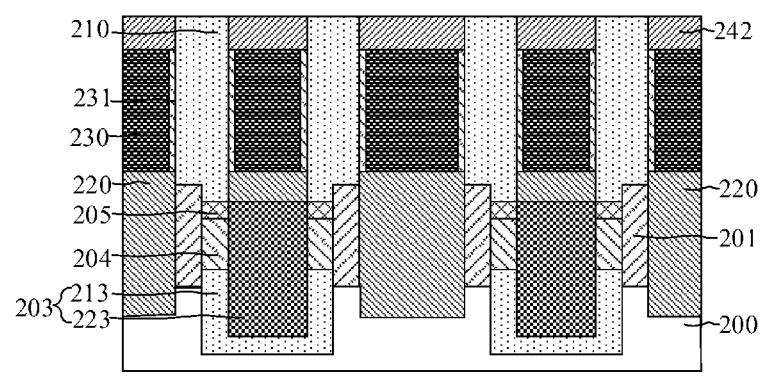
Figure 40:
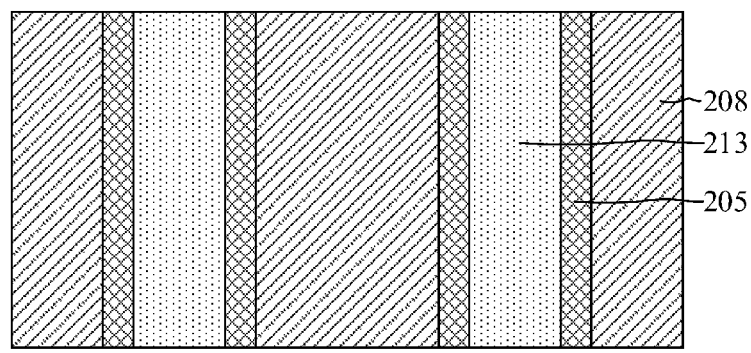
Figure 41:
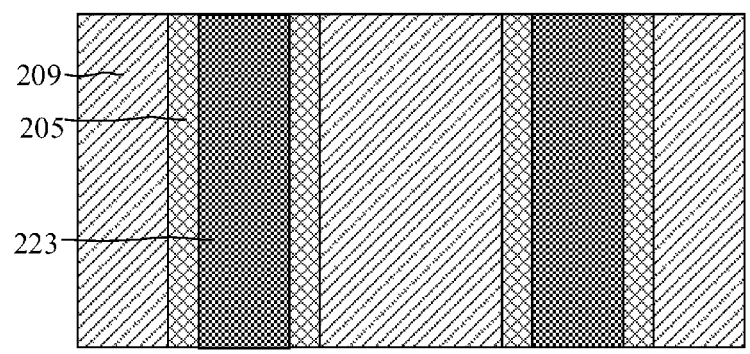
Figure 42:
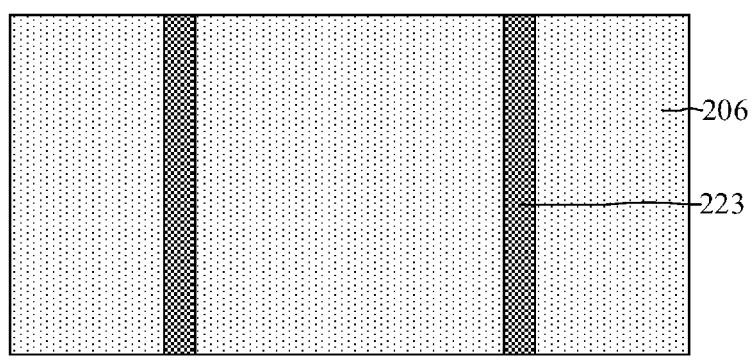
Figure 43:
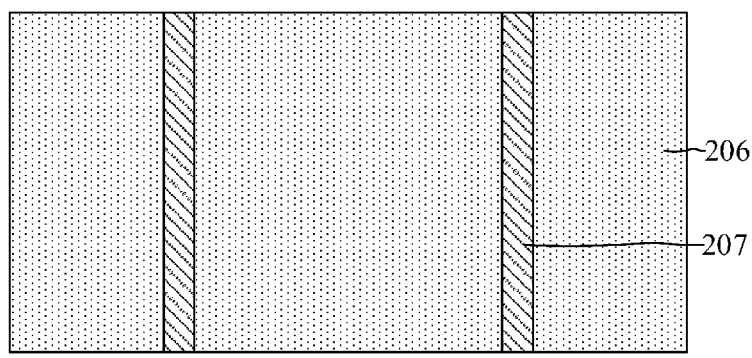
Figure 44:
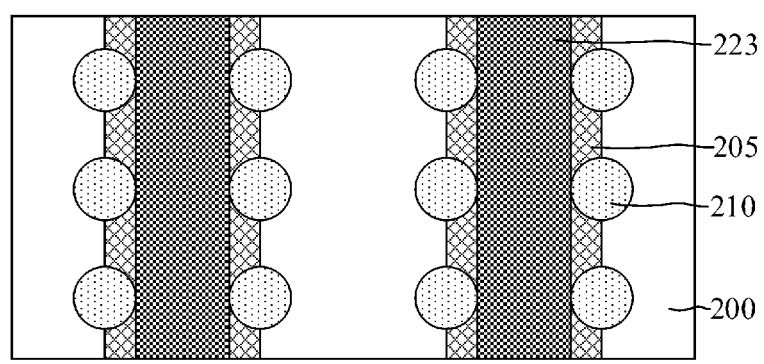
Figure 45:
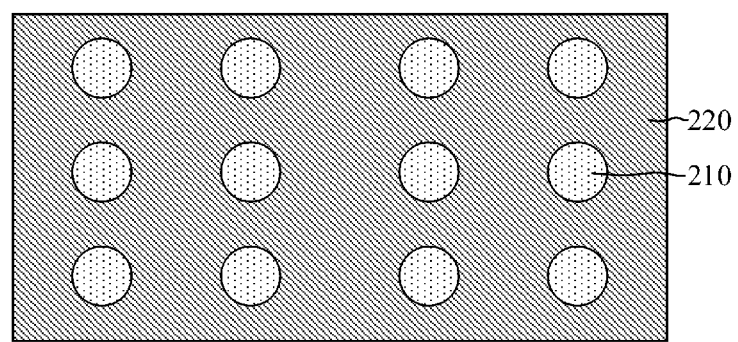
Figure 46:
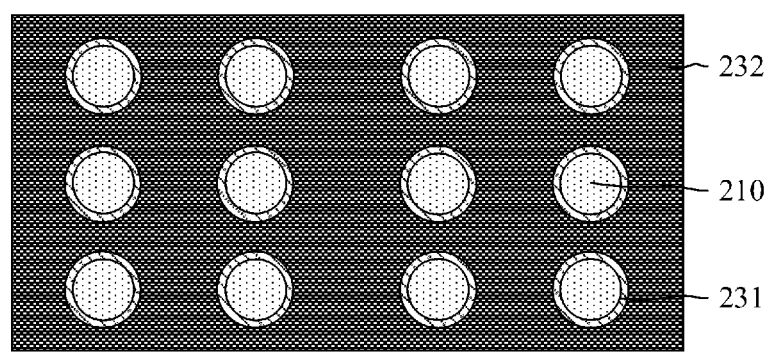
Figure 47:
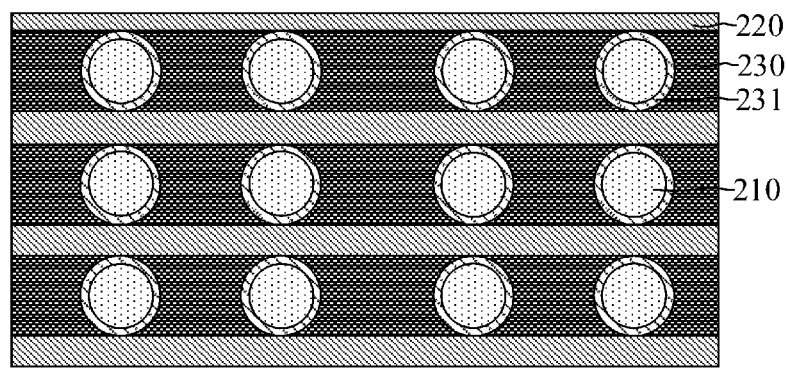
Figure 48:
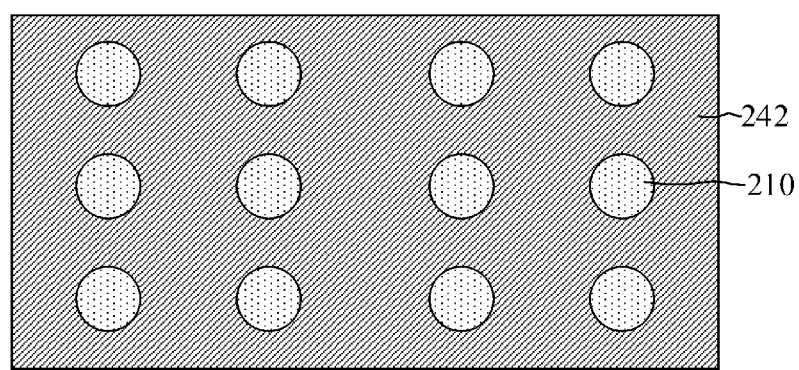
Figure 49:
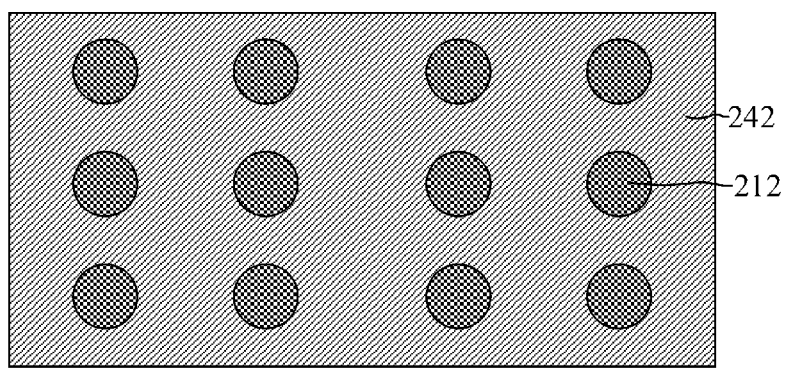

FIGS. 29 and 40, a second barrier layer 223 is formed, the second barrier layer 223 fills the third trench 252, and the second barrier layer 223 and the first barrier layer 213 constitute the barrier layer 203.

In some embodiments, the second barrier layer 223 is used to block the diffusion of metal ions between adjacent bit lines 204, and the material of the second barrier layer 223 is the same as the material of the first barrier layer 213, thereby improving the second barrier layer 223. The interface properties between the barrier layer 223 and the first barrier layer 213 are beneficial to improve interface state defects, thereby improving the electrical properties of the semiconductor structure. In other embodiments, the material of the second barrier layer may be different from the material of the first barrier layer.

In other embodiments, a third barrier layer is formed on the initial semiconductor substrate, the third barrier layer is also located in the trench, a fourth trench is formed, and the sidewalls of the fourth trench expose the first dopant layer surface, and the bottom surface of the fourth trench is higher than the bottom surface of the first doping layer, a stacked bit line and a dielectric layer are sequentially formed on the initial semiconductor substrate, and the stacked bit line and the dielectric layer are also located in the fourth trench, and the remaining third barrier layer acts as a barrier layer.

In some embodiments, the formation method of the subsequent semiconductor structure shown in FIG. 30 to FIG. 36 corresponding to each step in the structure schematic diagram and the previous embodiment in FIG. 7 to FIG. 14 corresponding to each step in the formation method of the schematic diagram of the formation method, they are the same or very similar, so the formation methods of the subsequent semiconductor structures corresponding to the respective steps in FIG. 30 to FIG. 36 will not be described in detail.

In some embodiments, there are at least two bit lines 204, the semiconductor doping layer 201 is located on one side of the bit line 204, and the semiconductor doping layers 201 of the two adjacent bit lines 204 are located on different sides; the isolation layer 220 is also located on the top surface of the barrier layer 203 exposed by the semiconductor channel 210, and the isolation layer 220 is located between the word line 230 and the barrier layer 203; the word line 230 is located on the top surface of the barrier layer 203 exposed by the semiconductor channel 110.

In the technical solution of the semiconductor structure provided by the embodiment of the present disclosure, the semiconductor channel 210 is located on the bit line 204 and the semiconductor doping layer 201 is located on the side of the bit line 204 to increase the contact between the bit line structure and the active structure, it is beneficial to improving the prior weak conductivity between the bit line structure and the active structure, thereby improving the stability of the semiconductor structure; the word line 230 surrounds part of the semiconductor channel 210, that is, the semiconductor structure is a GAA structure, and the GAA structure can realize the four-sided wrapping of the gate to the channel region of the semiconductor, so can largely solve the problems of leakage current, capacitance effect and short channel effect caused by the reduction of the gate pitch size, and reduce the vertical direction of the word line 230. The occupied area is beneficial to enhancing the gate control performance and improving the integration of the semiconductor structure.

Those of ordinary skill in the art can understand that the above-mentioned embodiments are specific examples for realizing the present disclosure, and in practical application, various changes can be made to it in form and detail without departing from the present disclosure spirit and scope. Any person skilled in the art can make various changes and modifications without departing from the spirit and scope of the present disclosure. Therefore, the protection scope of the present disclosure should be based on the scope defined by the claims.

The invention claimed is:

1. A semiconductor structure, comprising:
   a substrate comprising bit lines extending along a first direction on the substrate;
   a semiconductor channel formed on one of the bit lines;
   a semiconductor doping layer, wherein the semiconductor doping layer is arranged on a side of one of the bit lines, and wherein a top surface of the semiconductor doping layer is in contact with the semiconductor channel;
   a word line extending in a second direction, wherein the word line surrounds a portion of the semiconductor channel, wherein a bottom surface of the word line is arranged higher than a top surface of the bit lines;
   a word line dielectric layer, wherein the word line dielectric layer is formed between the word line and the semiconductor channel; and
   an isolation layer, wherein the isolation layer is arranged between the word line and the bit lines, and also between the word line and the semiconductor doping layer.

2. The semiconductor structure of claim 1, wherein in the first direction, one of the bit lines comprises at least two rows of the semiconductor channels arranged at an interval, wherein the semiconductor doping layer is arranged at both sides of one of the bit lines.

3. The semiconductor structure of claim 1, wherein there are at least two bit lines, and the semiconductor doping layer is located on one side of the bit lines.

4. The semiconductor structure of claim 3, wherein the semiconductor doping layer of the two adjacent bit lines is arranged on different sides of the bit lines.

5. The semiconductor structure of claim 1, wherein a material of the bit lines comprises metal; wherein the semiconductor structure further comprises: a dielectric layer, wherein the dielectric layer is arranged to be on the top surface of the bit lines, and wherein the semiconductor doping layer is also arranged on a side surface of the dielectric layer, and wherein the semiconductor channel is arranged on a surface of the dielectric layer.

6. The semiconductor structure of claim 1, wherein the substrate is a semiconductor substrate; wherein the semiconductor structure further comprises: a barrier layer, wherein the barrier layer is arranged in the substrate and protrudes above the substrate, and wherein the semiconductor channel is arranged on a portion of a top surface of the barrier.

7. The semiconductor structure of claim 6, wherein the isolation layer is further arranged on the top surface of the barrier layer exposed by the semiconductor channel, and wherein the isolation layer is located between the word line and the barrier layer.

8. The semiconductor structure of claim 6, wherein the word line is located on the top surface of the barrier layer exposed by the semiconductor channel.

9. The semiconductor structure of claim 1, wherein, in a direction parallel to the second direction, a width of the bit line is 2 to 3.5 times a maximum width of the semiconductor channel.

10. The semiconductor structure of claim 9, wherein, in the direction parallel to the second direction, the maximum width of the semiconductor channel ranges from 10 nm to 20 nm.

11. The semiconductor structure of claim 1, wherein the semiconductor doping layer comprises N-type ions or P-type ions; and wherein the semiconductor channel comprises:
   a channel region, wherein the channel region of the semiconductor channel faces the word line, and wherein the channel region is doped with N-type ions or P-type ions; and
   a doping region, wherein the doping region of the semiconductor channel is an region other than the channel region, and wherein a type of doping ions in the doping region is a same as a type of doping ions in the semiconductor doping layer.

12. The semiconductor structure of claim 11, wherein a type of dopant ions in the channel region is different from the type of dopant ions in the semiconductor doping layer.

13. The semiconductor structure of claim 1, wherein an orthographic projection area of the bit lines on the substrate ranges from 0.5 times to 0.8 times as an orthographic projection area of the semiconductor channel on the substrate.

14. The semiconductor structure of claim 1, wherein a material of the semiconductor channel is a same as a material of the semiconductor doping layer; and wherein the material of the semiconductor channel comprises silicon, germanium, or silicon germanium.

15. The semiconductor structure of claim 1, wherein the word lines are arranged spaced apart, wherein the semiconductor structure further comprises:
   a first isolation layer, wherein the first isolation layer is arranged between adjacent word lines; and
   a second isolation layer, wherein the second isolation layer is arranged on the word lines and the first isolation layer, and wherein the second isolation layer is also located on a side of the semiconductor channel away from the word lines.

16. A method for manufacturing a semiconductor structure, comprising:
   providing a substrate with bit lines extending in a first direction;
   forming a semiconductor doping layer and a semiconductor channel, wherein the semiconductor channel is arranged to be on the bit lines, wherein the semiconductor doping layer is arranged on a side of the bit lines, and wherein a top surface of the semiconductor doping layer is in contact with the semiconductor channel;

forming a word line extending along the second direction and a word line dielectric layer, wherein the word line surrounding a part of the semiconductor channel, and wherein a bottom surface of the word line is higher than a top surface of the bit lines, wherein the word line dielectric layer is arranged t obe between the word lines and the semiconductor channel; and forming an isolation layer between the word lines and the bit lines, and between the word lines and the semiconductor doping layer.

17. The method for manufacturing the semiconductor structure according to claim 16, wherein process steps of forming the semiconductor doping layer and the semiconductor channel comprise:

providing a stacked initial semiconductor substrate and a first doping layer, wherein the first doping layer is doped with N-type ions or P-type ions, and wherein the first doping layer comprises the bit lines;

forming a semiconductor layer on a top surface of the first doping layer and the bit lines; and patterning the semiconductor layer and the first doping layer, wherein a remaining semiconductor layer is used as the semiconductor channel, and wherein a remaining first doping layer is used as the semiconductor doping layer.

18. The method for manufacturing the semiconductor structure according to claim 17, the method further comprises: performing a selective epitaxy process to form a second doping layer, wherein the second doping layer comprises trenches; wherein before pattering the semiconductor layer and the first doping layer, forming a sacrificial layer; and wherein the sacrificial layer fills the trenches; and after patterning the semiconductor layer and the first doping layer, removing the sacrificial layer.

19. The method for manufacturing the semiconductor structure according to claim 16, wherein the method further comprises: after forming the word lines, doping with doping ions a portion of the semiconductor channel higher than a surface of the word lines, wherein the doping ions are of a same type as doping ions in the semiconductor doping layer.

* * * * *